United States Patent
Kitabatake et al.

(10) Patent No.: US 6,700,532 B2
(45) Date of Patent: Mar. 2, 2004

(54) MAGNETRON DRIVE CIRCUIT

(75) Inventors: Asao Kitabatake, Nishinomiya (JP); Akio Funae, Nishinomiya (JP)

(73) Assignee: Furuno Electric Company, Limited, Hyogo-ken (JP)

( * ) Notice: Subject to any disclaimer, the term of this patent is extended or adjusted under 35 U.S.C. 154(b) by 0 days.

(21) Appl. No.: 10/237,594

(22) Filed: Sep. 10, 2002

(65) Prior Publication Data

US 2003/0058160 A1 Mar. 27, 2003

(30) Foreign Application Priority Data

Sep. 10, 2001 (JP) .................................... 2001-273917

(51) Int. Cl.$^7$ ............................................... G01S 7/22
(52) U.S. Cl. ...................... 342/175; 342/202; 342/204; 307/106; 331/87
(58) Field of Search ................................ 342/175, 202, 342/204; 307/106, 107, 108; 315/39.51, 39.75; 323/223, 282; 331/86, 87

(56) References Cited

U.S. PATENT DOCUMENTS

| | | | | | |
|---|---|---|---|---|---|
| 4,012,617 | A | * | 3/1977 | Burke et al. ................. | 219/716 |
| 4,682,114 | A | * | 7/1987 | Aucouturier et al. ......... | 328/67 |
| 4,684,821 | A | * | 8/1987 | Picone et al. ................ | 307/106 |
| 5,319,665 | A | | 6/1994 | Birx .......................... | 372/69 |
| 5,808,495 | A | * | 9/1998 | Tanigaki et al. ............. | 327/181 |
| 5,905,646 | A | * | 5/1999 | Crewson et al. ............. | 363/132 |
| 6,359,420 | B1 | * | 3/2002 | Hitchcock .................... | 320/141 |
| 2003/0058160 | A1 | * | 3/2003 | Kitabatake et al. .......... | 342/175 |

FOREIGN PATENT DOCUMENTS

GB  2135547 A  8/1984

OTHER PUBLICATIONS

"Synthesized pulse forming networks for long pulse high duty cycle magnetron or other type loads", O'Loughlin, J.P.; Loree, D.L.; Pulsed Power Conference, 1999. Digest of Technical Papers. 12th IEEE International, 1999 Page(s): 429–432 vol. 1.*

"Synthesized pulse forming networks for long pulse high duty cycle magnetron or other type loads", O'Loughlin, J.P.; Loree, D.L.; Pulsed Power Conference, 1999. Digest of Technical Papers. 12th IEEE Int'l, vol: 1 , Jun. 27–30, 1999 Ps: 429–432.*

* cited by examiner

*Primary Examiner*—John B. Sotomayor
(74) *Attorney, Agent, or Firm*—Birch, Stewart, Kolasch & Birch, LLP

(57) ABSTRACT

The invention provides a magnetron drive circuit which drives a magnetron to produce a generally rectangular-shaped narrow transmission pulse having sharply shaped rising and falling edges. The magnetron drive circuit includes a nonlinear load circuit and an active damper circuit. The nonlinear load circuit becomes on at around 80% of a peak output voltage of a pulse transformer (at which the magnetron begins to oscillate) is connected to a secondary winding of the pulse transformer in parallel with the magnetron. The active damper circuit absorbs residual energy left in the pulse transformer without any need for an absorption resistor conventionally connected between both ends of a primary winding of the pulse transformer.

22 Claims, 5 Drawing Sheets

MAGNETRON DRIVE CIRCUIT

BACKGROUND OF THE INVENTION

1. Field of the Invention

This invention relates to a drive circuit for a magnetron used in a pulse-modulated radar, for example.

2. Description of the Prior Art

A pulse-modulated radar (hereinafter referred to simply as the pulse radar) is a radar which determines the distance to a target from the time that elapses after transmitting pulsed waves toward the target before a portion of the pulsed waves reflected by the target is received. Given the velocity of light, c, and the elapsed time $\Delta t$ between transmission and reception, the distance D to the target is calculated as follows:

$$D = c\Delta t / 2$$

Important factors for judging the performance of the pulse radar are such characteristics as bearing discrimination, maximum and minimum detecting ranges, as well as range discrimination. The range discrimination is defined as a minimum distance R at which two targets placed on the same bearing with respect to a radar antenna can be displayed separately. Since radio waves propagate with a speed of about 300 m/$\mu$s, they make a round trip of about 150 m within a period of 1 $\mu$s. Thus, there is a relationship expressed by the following equation between pulselength $\tau$ ($\mu$s) and the range discrimination R:

$$R = 300\tau/2 = 150\tau \text{(m)}$$

Basically, the range discrimination is determined by pulselength, that is, the smaller the pulselength, the better the range discrimination and short-range detection.

The construction of a pulse radar is now generally described. The pulse radar is constructed of a magnetron for generating microwaves, a magnetron drive circuit for driving the magnetron, an antenna, a receiver circuit and other electronic components. FIG. 3 is a circuit diagram generally showing the configuration of a conventional magnetron drive circuit 101. As depicted in FIG. 3, a pulse transformer 11 is used in the conventional magnetron drive circuit 101. One end of a primary winding 12 of the pulse transformer 11 is connected directly to a power source V and grounded through a capacitor 20 while the other end of the primary winding 12 is connected to a drain of a switching n-channel metaloxide-semiconductor field effect transistor (NMOSFET) 21 (hereinafter referred to as the switching FET 21). A source of the switching FET 21 is directly grounded and its gate is grounded through a resistor 22. An absorption resistor 23 is normally connected between both ends of the primary winding 12. On the other hand, one end of a secondary winding 13 of the pulse transformer 11 is connected to a cathode of the magnetron (not shown) while the other end of the secondary winding 13 is connected to an anode of the magnetron.

In the magnetron drive circuit 101 constructed as described above, the switching FET 21 turns on when a transmission trigger having a specific pulselength is fed into the gate of the switching FET 21. As a result, a high-voltage pulse having the same pulselength is generated. When the high-voltage pulse is applied to the magnetron, it oscillates and produces an extremely high-power microwave output (transmission pulse), which is radiated from the radar antenna (not shown).

It has been recognized that the combination of the aforementioned magnetron drive circuit 101 and the magnetron of the prior art has a problem known as a transmission missing phenomenon which occurs as follows. If the rising edge of a pulse for driving the magnetron is made too sharp to obtain a narrow pulselength, the magnetron will fail to oscillate, resulting in an inability to generate the transmission pulse.

Also, it is generally needed to sharpen the falling edge of the transmission pulse to obtain a narrow pulselength. In the conventional magnetron drive circuit 101, the absorption resistor 23 is added as stated above to decrease residual energy left in the pulse transformer 11 to zero level in a short time. The absorption resistor 23, however, acts as an extra load in a rising period of the transmission pulse. Therefore, the resistance value of the absorption resistor 23 can not be made so small that it is impossible to obtain so sharp a falling edge of the transmission pulse.

FIG. 4 is a diagram showing the waveform of an input pulse fed into the conventional magnetron drive circuit 101 (bottom) and the waveform of a transmission pulse applied to the magnetron (top). Although the transmission pulse ideally should have a rectangular shape, the actual transmission pulse has a sawtooth shape as depicted in FIG. 4.

SUMMARY OF THE INVENTION

The invention is intended to provide a solution to the aforementioned problems of the prior art. Accordingly, it is an object of the present invention to provide a radar signal generator for producing a magnetron driving signal so that the aforementioned problems will be solved.

Accordingly, it is another object of the invention to provide a magnetron drive circuit which drives a magnetron to produce a generally rectangular-shaped narrow transmission pulse having sharply shaped rising and falling edges.

According to the invention, a magnetron drive circuit comprises a nonlinear load circuit, which becomes ON at a voltage approximately equal to a voltage at which a magnetron begins to oscillate, is connected to a secondary winding of a pulse transformer for generating a pulse for driving the magnetron in parallel with the magnetron.

This construction ensures that the flow of electrons from a cathode to an anode of the magnetron properly oscillates in an initial stage of oscillation. In other words, the construction of the invention helps prevent the so-called transmission missing phenomenon which could occur if the flow of electrons reaches the anode of the magnetron resulting in a failure of oscillation. Since the magnetron used in a pulse-modulated radar begins to oscillate typically at around 80% of a peak point of applied voltage, it is preferred to reduce the rate of increase of the magnetron input voltage within a time period during which the voltage applied to the magnetron rises from 80% to 100% of the peak voltage. On the other hand, because the transmission missing phenomenon does not occur even if the applied voltage is rapidly increased until the magnetron begins to oscillate, the rising edge of the magnetron input voltage is sharpened during a pre-oscillation period of the magnetron to obtain a narrow transmission pulse width.

In one aspect of the invention, the nonlinear load circuit includes a diode which breaks down at a voltage approximately equal to the voltage at which the magnetron begins to oscillate. The nonlinear load circuit of this feature can be produced by using an element easily available on the market.

In another aspect of the invention, the nonlinear load circuit is configured by connecting a parallel circuit, which is formed of a series circuit including a first resistor having a resistance approximately equal to the rated internal impedance of the magnetron and a capacitor having a specific capacitance and a second resistor having a resistance corresponding to two to three times the rated internal impedance of the magnetron, to the aforementioned diode in series.

In this construction, the first resistor, the capacitor and the second resistor together act as a temporary load, the capacitor serving as a particularly large load, when the diode has broken down. This helps decrease the rate of voltage rise close to the voltage at which the magnetron begins to oscillate, making it possible to prevent the transmission missing phenomenon in a more reliable manner.

In another aspect of the invention, the magnetron drive circuit further comprises a residual energy absorption circuit for absorbing residual energy left in the pulse transformer by short-circuiting one of its windings approximately at the same time as the voltage level of a transmission trigger fed into a primary winding of the pulse transformer begins to fall.

The residual energy absorption circuit absorbs the residual energy left in the pulse transformer without producing adverse effects on the shape of the magnetron transmission pulse during its rising period. In addition, since the residual energy absorption circuit absorbs the residual energy approximately at the same time that the residual energy in the pulse transformer becomes no longer needed, it is possible to make the falling edge of the transmission pulse sharper than that obtained with the prior art.

In another aspect of the invention, a magnetron drive circuit comprises a residual energy absorption circuit for absorbing residual energy left in a pulse transformer for generating a pulse for driving a magnetron by short-circuiting one of its windings approximately at the same time as the voltage level of a transmission trigger fed into a primary winding of the pulse transformer begins to fall.

Since the residual energy absorption circuit efficiently absorbs the residual energy left in the pulse transformer, it is possible to make the falling edge of the transmission pulse sharper than that obtained with the prior art.

In still another aspect of the invention, a magnetron drive circuit comprises a residual energy absorption circuit for absorbing residual energy left in a pulse transformer for generating a magnetron driving pulse to eliminate the need for an absorption resistor conventionally connected between both ends of a primary winding of the pulse transformer for absorbing the residual energy left in the pulse transformer.

The conventional absorption resistor connected between both ends of the primary winding has been associated with a problem that it acts as an extra load in a rising period of the magnetron transmission pulse, making it impossible to decrease the resistance value of the absorption resistor to a large extent and to obtain a sharp falling edge of the transmission pulse. In contrast, the aforementioned arrangement of the invention makes it possible to obtain a magnetron transmission pulse of a small pulselength having a generally rectangular waveform with sharply shaped rising and falling edges without producing adverse effects on the shape of the rising edge of the magnetron transmission pulse.

In further aspect of the invention, a radar signal generator comprises a magnetron for producing a radar signal, a signal generator for producing a generally rectangular waveform with a sharply shaped rising edge and a sharply shaped falling edge and supplying the signal from said signal generator to said magnetron.

In still further aspect of the invention, a radar signal generator comprises a magnetron for producing a radar signal, a pulse transformer having two primary windings and a secondary winding which is connected to said magnetron, a first switching semiconductor device having an input terminal and a output terminal which is connected to said magnetron, a second switching semiconductor device having an input terminal and an output terminal which is connected to one of said primary winding, wherein a transmission signal is supplied to the input terminal of said first switching semiconductor device and a generally rectangular signal is supplied to the input terminal of said second switching semiconductor device so that a generally rectangular waveform is produced at a secondary winding of said transformer with a sharply shaped rising edge and a sharply shaped falling edge.

These and other objects, features and advantages of the invention will become more apparent upon reading the following detailed description in conjunction with the accompanying drawings.

DETAILED DESCRIPTION OF THE PREFERRED EMBODIMENTS OF THE INVENTION

Figure 1:
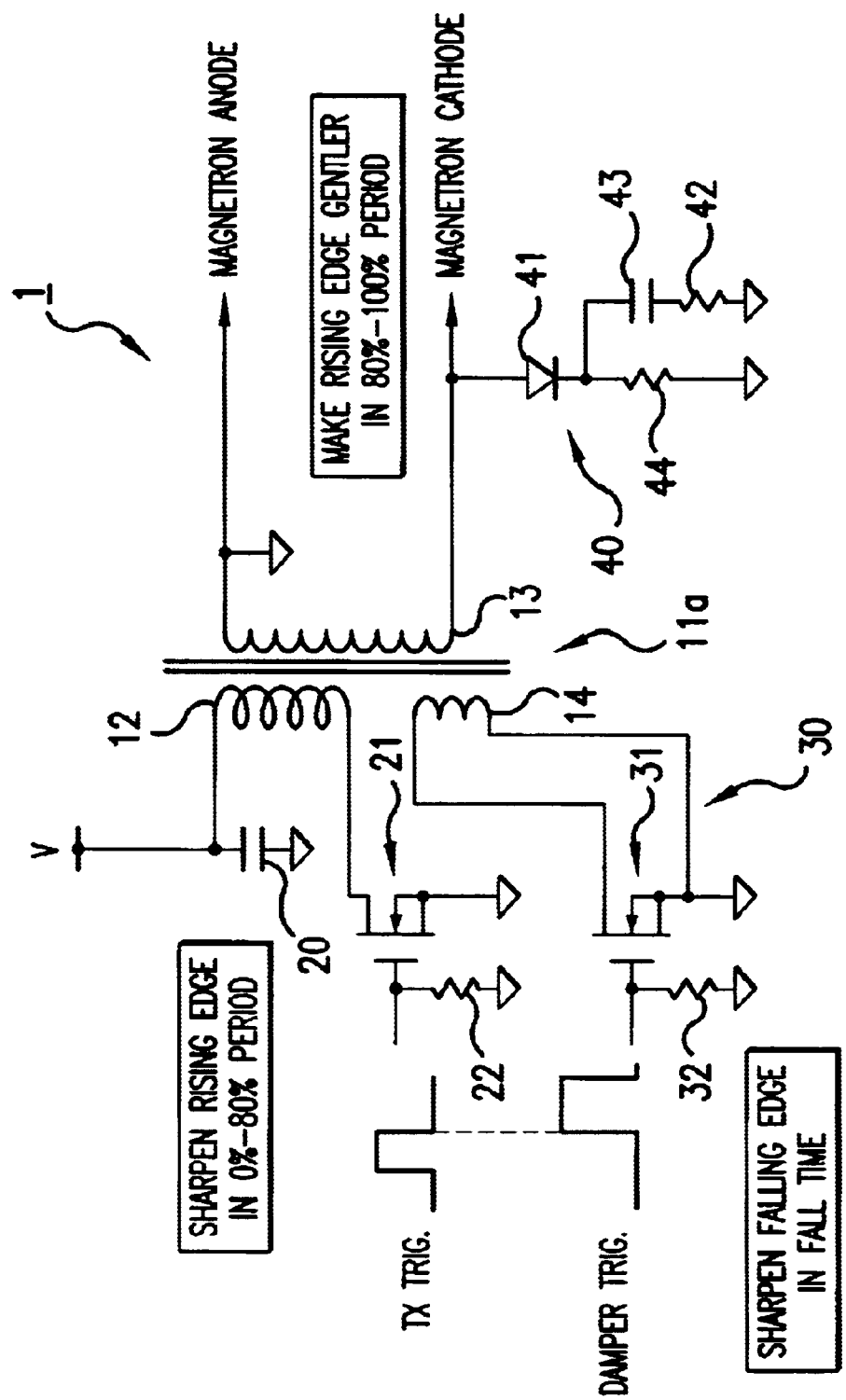
FIG. 1 is a circuit diagram generally showing the configuration of a magnetron drive circuit according to an embodiment of the invention.

FIG. 1 is a circuit diagram of generally showing the configuration of a magnetron drive circuit 1 according to the first preferred embodiment of the invention. In FIG. 1, elements identical to those of the aforementioned conventional magnetron drive circuit 101 are designated by the same reference numerals.

The magnetron drive circuit 1 of this invention may be regarded as a modified version of the conventional magnetron drive circuit 101 that has an auxiliary winding 14 added to a pulse transformer 11a. The auxiliary winding 14 constitutes part of an active damper circuit 30 which acts as a residual energy absorption circuit for absorbing residual energy left in the pulse transformer 11a. Further, a nonlinear load circuit 40 which becomes ON at about 80% of a peak voltage output from the pulse transformer 11a is connected to a secondary winding 13 of the pulse transformer 11a in parallel with a magnetron. Given this circuit configuration, the magnetron drive circuit 1 drives the magnetron in such a way that it outputs a transmission pulse of a narrow pulselength having a generally rectangular waveform with sharply shaped rising and falling edges.

The magnetron drive circuit 1 of the first embodiment invention is now described in more detail referring to the drawings. As stated above, the magnetron drive circuit 1 is provided with the active damper circuit 30 and the nonlinear load circuit 40 connected to the pulse transformer 11*a*, which includes a primary winding 12 and the aforementioned secondary winding 13 and auxiliary winding 14.

One end of the primary winding 12 is connected directly to a power source V and grounded through a capacitor 20 while the other end of the primary winding 12 is connected to a drain of a switching FET (NMOSFET) 21. A source of the switching FET 21 is directly grounded and its gate is grounded through a resistor 22. On the other hand, one end of the secondary winding 13 of the pulse transformer 11*a* is connected to a cathode of the magnetron (not shown) while the other end of the secondary winding 13 is connected to an anode of the magnetron.

The active damper circuit 30 includes the auxiliary winding 14, an active damper switching FET (NMOSFET) 31 and a resistor 32. One end of the auxiliary winding 14 is connected to a drain of the switching FET 31 while the other end of the auxiliary winding 14 is grounded. A source of the active damper switching FET 31 is directly grounded while a gate of the active damper switching FET 31 is grounded through the resistor 32.

The nonlinear load circuit 40 includes a diode 41, a resistor 42 serving as a first resistor, a capacitor 43 and a resistor 44 serving as a second resistor. This nonlinear load circuit 40 is configured by connecting a parallel circuit formed of the resistor 44 and a series circuit of the resistor 42 and the capacitor 43 to the diode 41 in series. The diode 41 breaks down at about 80% of the peak voltage of the pulse transformer 11*a*. This 80% level of the peak voltage is approximately equal to a voltage level at which the magnetron begins to oscillate. The diode 41 is preferably a Zener diode or an avalanche diode, for example. The resistor 42 has a resistance value approximately equal to the rated internal impedance of the unillustrated magnetron. The capacitance of the capacitor 43 is determined such that the time constant of a CR circuit formed of the series-connected resistor 42 and capacitor 43 becomes smaller than the pulselength of the transmission pulse. As an example, the capacitance of the capacitor 43 is set to about 100 pF. The resistance of the resistor 44 is set to a value corresponding to two to three times the rated internal impedance of the magnetron, It is to be noted that a diode can be used in place of the resistor 44.

Since no absorption resistor is connected between both ends of the primary winding 12 in this magnetron drive circuit 1, the magnetron drive circuit 1 of the invention can sharpen the rising edge of the transmission pulse fed into the magnetron by increasing the rate of voltage rise within a time period during which the voltage level of the transmission pulse rises from 0% to 80% of the peak output voltage of the pulse transformer 11*a* compared to the conventional magnetron drive circuit 101. Furthermore, the switching effect of the switching FET 21 is improved due to the elimination of the conventional absorption resistor.

Furthermore, the provision of the nonlinear load circuit 40 makes it possible to produce a more gently rising leading edge of the transmission pulse fed into the magnetron by decreasing the rate of voltage rise within a time period during which the voltage level of the transmission pulse rises from 80% to 100% of the peak output voltage of the pulse transformer 11*a* compared to the transmission pulse rising edge obtained with the conventional magnetron drive circuit 101. This would serve to prevent the transmission missing problem.

Moreover, the active damper circuit 30 provided instead of the absorption resistor 23 (connected between both ends of the primary winding 12) of the prior art absorbs the residual energy left in the pulse transformer 11*a*. Since the active damper circuit 30 has a higher energy absorbing efficiency than the absorption resistor 23, the falling edge of the transmission pulse can be made sharper than that obtained with the conventional magnetron drive circuit 101. In addition, the provision of the active damper circuit 30 does not produce adverse effects on the waveform of the transmission pulse during its rising period.

Figure 2:
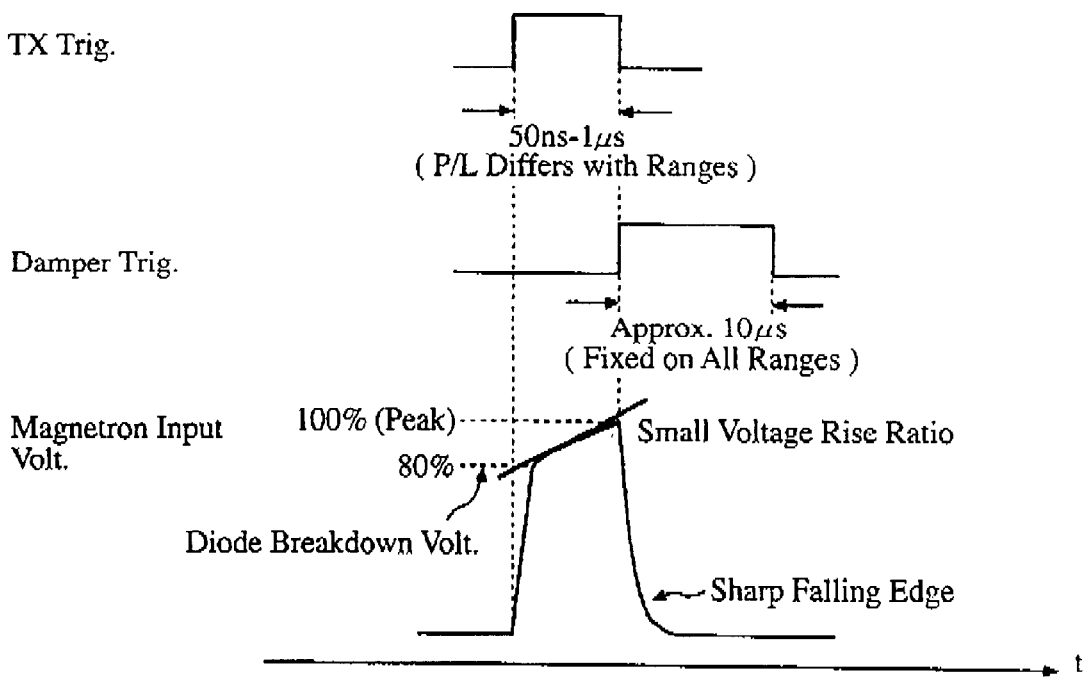
FIG. 2 is a diagram showing the waveforms of input and output pulses of the magnetron drive circuit of the embodiment of the invention.
Figure 3:
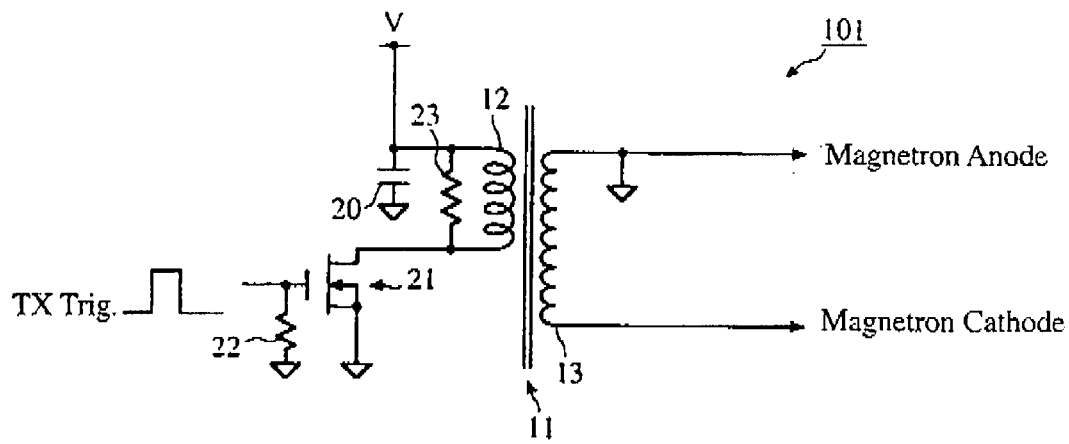
FIG. 3 is a circuit diagram generally showing the configuration of a conventional magnetron drive circuit.
Figure 4:
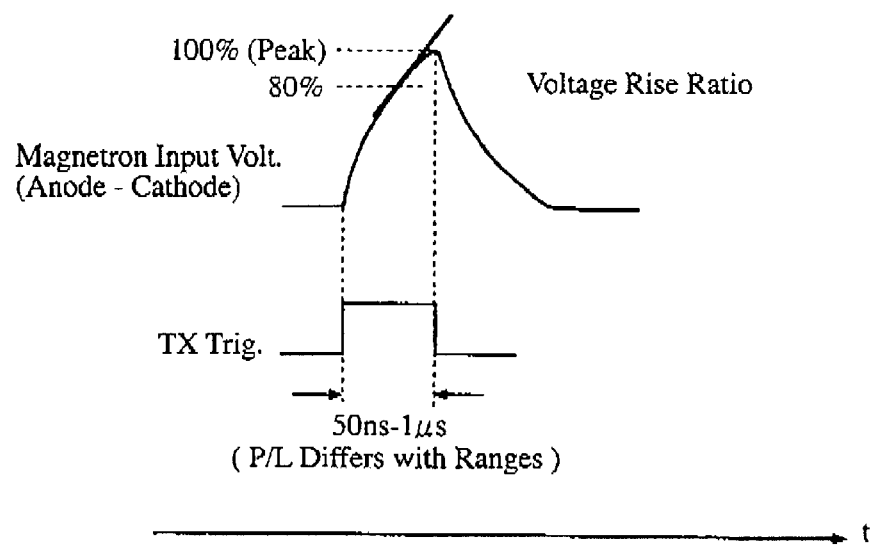
FIG. 4 is a diagram showing the waveform of an input pulse fed into the conventional magnetron drive circuit and the waveform of an output transmission pulse of a magnetron.

FIG. 2 is a diagram showing the waveforms of input and output pulses of the magnetron drive circuit 1 of a first embodiment. When a transmission trigger and a damper trigger shown in FIG. 2 are fed into the magnetron drive circuit 1, it outputs a narrow transmission pulse having a generally rectangular waveform with sharply shaped rising and falling edges. In a pulse radar, the pulselength of the transmission trigger (transmission pulse) is normally varied with range scales. As an example, the pulselength may be selected within a range of 50 ns to 1 $\mu$s. When a rectangular transmission trigger is fed into the switching FET 21 of the magnetron drive circuit 1, magnetron input voltage sharply increases at the rising edge of the trigger pulse. When the input voltage reaches approximately 80% of the peak voltage, the diode 41 breaks down and the rate of increase of the magnetron input voltage rapidly decreases because breakdown voltage of the magnetron is made approximately equal to the 80% level of the peak voltage. Since the resistor 42, the capacitor 43 and the resistor 44 having the aforementioned resistance and capacitance values act as a load when the diode 41 has broken down, it is possible to decrease the rate of voltage rise of the transmission pulse within the time period during which the voltage level of the transmission pulse rises from 80% to 100% of the peak output voltage of the pulse transformer 11*a* in a reliable fashion. The magnetron input voltage reaches a peak point immediately before the voltage level of the transmission pulse begins to fall.

The damper trigger is fed into the active damper switching FET 31 of the magnetron drive circuit 1 when the voltage level of the transmission trigger has begun to fall. The damper trigger is a pulse having a fixed pulselength, e.g., 10 $\mu$s, regardless of the range scale of the pulse radar. Since the active damper circuit 30 absorbs the residual energy left in the pulse transformer 11*a* as the voltage level of the damper trigger increases, the magnetron input voltage rapidly decreases.

By controlling the magnetron input voltage in the aforementioned manner, it is possible to cause the magnetron to emit a generally rectangular-shaped narrow transmission pulse (pulse-modulated radio waves) having sharply shaped rising and falling edges. As the pulselength is about 1 $\mu$s and the duty cycle is approximately 1/1000, losses caused by the active damper switching FET 31 and the diode 41 are small and an increase in power loss in the whole magnetron drive circuit 1 caused by the provision of the active damper circuit 30 and the nonlinear load circuit 40 is considerably small.

While a −20 dB pulselength is normally used as a criterion for comparing pulselengths, it is possible in this embodiment to make the −20 dB pulselength of the pulse emitted by the magnetron narrower than that obtained by the prior art. Therefore, it is possible to better the range discrimination and significantly improve the minimum detecting range.

While the pulselength of the transmission pulse fed into the magnetron is approximately 1 μs in the aforementioned embodiment, the invention is not limited to this setting. It is possible to have the magnetron emit radio waves in a stable fashion with pulselengths equal to or shorter than 50 μs.

While the active damper circuit 30 for short-circuiting the auxiliary winding 14 is configured by connecting the active damper switching FET 31 and other elements to the auxiliary winding 14 provided in the pulse transformer 11a in the embodiment, the invention is not limited to this construction. As an alternative, an active damper circuit (residual energy absorbing circuit) may be so configured as to absorb the residual energy left in the pulse transformer by short-circuiting the primary winding 12 or the secondary winding 13.

Furthermore, although the magnetron drive circuit 1 comprises the active damper circuit 30 and the nonlinear load circuit 40 in the aforementioned embodiment, the invention is not limited to this construction. The magnetron drive circuit may comprise only the active damper circuit 30 or the nonlinear load circuit 40. It is conventionally known that the larger the rated output power, the smaller the number of occurrences of the transmission missing phenomenon even when the rate of voltage rise is increased within the time period during which the voltage level of the transmission pulse rises from 80% to 100% of the peak input voltage of the magnetron. Based on this prior art teaching, only the active damper circuit may be provided in a magnetron drive circuit for larger radars.

Figure 5:
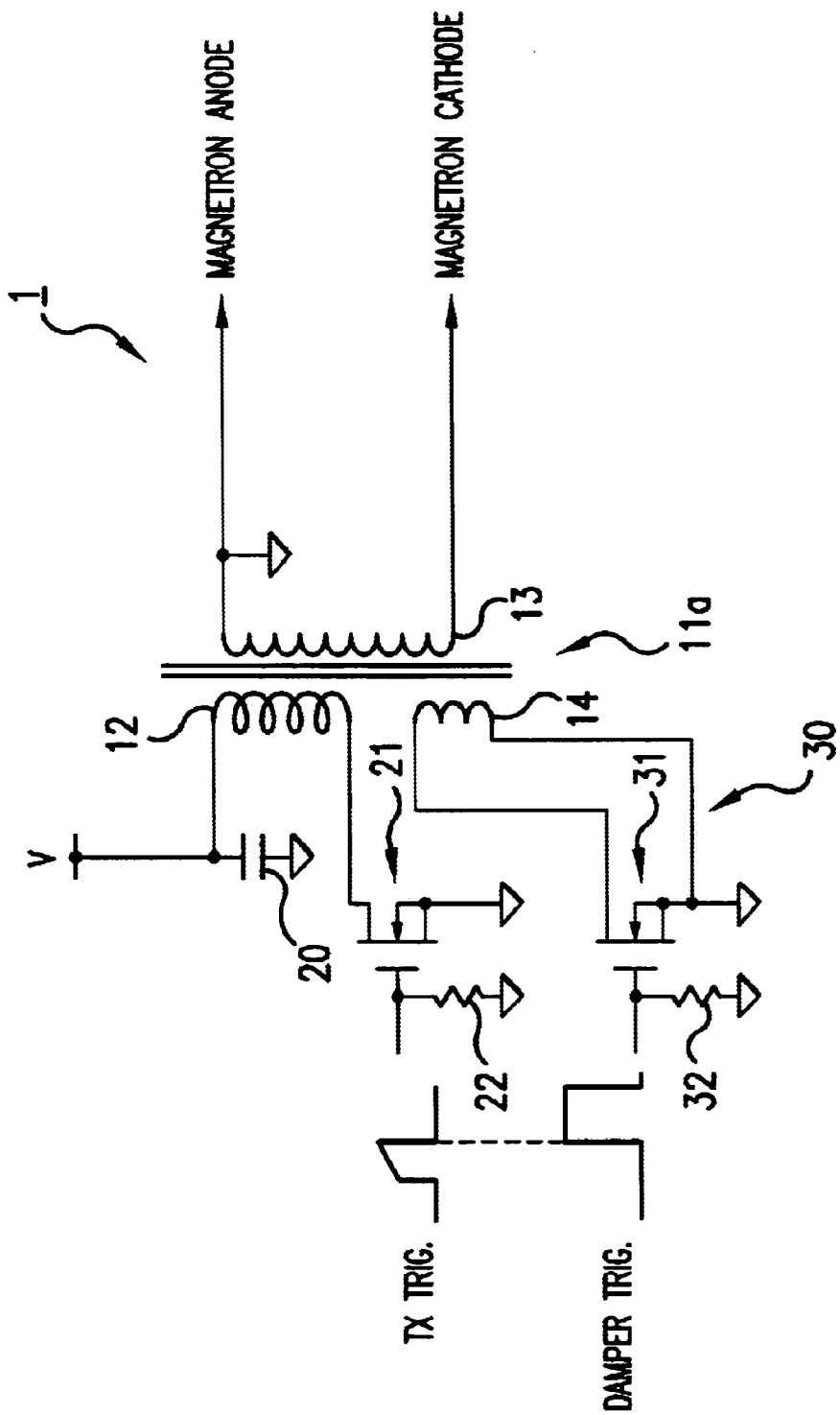
FIG. 5 is a circuit diagram generally showing the configuration of a magnetron drive circuit according to another embodiment of the invention.

Referring to FIG. 5, elements identical to those of the aforementioned magnetron drive circuit 1 in FIG. 1 are designated by the same reference numerals.

The magnetron drive circuit 1 includes a pulse transformer 11a having an auxiliary winding 14. The auxiliary winding 14 constitutes part of an active damper circuit 30 which acts as a residual energy absorption circuit for absorbing residual energy left in the pulse transformer 11a. A secondary winding 13 of the pulse transformer 11a is connected to the magnetron. Given this circuit configuration, the magnetron drive circuit 1 drives the magnetron in such a way that it outputs a transmission pulse of a narrow pulselength having a generally rectangular waveform with sharply shaped rising and falling edges.

The magnetron drive circuit 1 of the another embodiment invention is now described in more detail referring to the drawings. As explained above, the magnetron drive circuit 1 is provided with the active damper circuit 30 to the pulse transformer 11a, which includes a primary winding 12 and the aforementioned secondary winding 12 and an auxiliary winding 14.

One end of the primary winding 12 is connected directly to a power source V and grounded through a capacitor 20 while the other end of the primary winding 12 is connected to a drain of a switching FET (NMOSFET) 21. A source of the switching FET 21 is directly grounded and its gate is grounded through a resistor 22. On the other hand, one end of the secondary winding 13 of the pulse transformer 11a is connected to a cathode of the magnetron (not shown) while the other end of the secondary winding 13 is connected to an anode of the magnetron.

The active damper circuit 30 includes the auxiliary winding 14, an active damper switching FET (NMOSFET) 31 and a resistor 32. One end of the auxiliary winding 14 is connected to a drain of the switching FET 31 while the other end of the auxiliary winding 14 is grounded. A source of the active damper switching FET 31 is directly grounded while a gate of the active damper switching FET 31 is grounded through the resistor 32.

Since no absorption resistor is connected between both ends of the primary winding 12 in this magnetron drive circuit 1, the magnetron drive circuit 1 of the invention can sharpen the rising edge of the transmission pulse fed into the magnetron by increasing the rate of voltage rise within a time period during which the voltage level of the transmission pulse rises from 0% to 80% of the peak output voltage of the pulse transformer 11a compared to the conventional magnetron drive circuit 101. Furthermore, the switching effect of the switching FET 21 is improved due to the elimination of the conventional absorption resistor.

Figure 6:
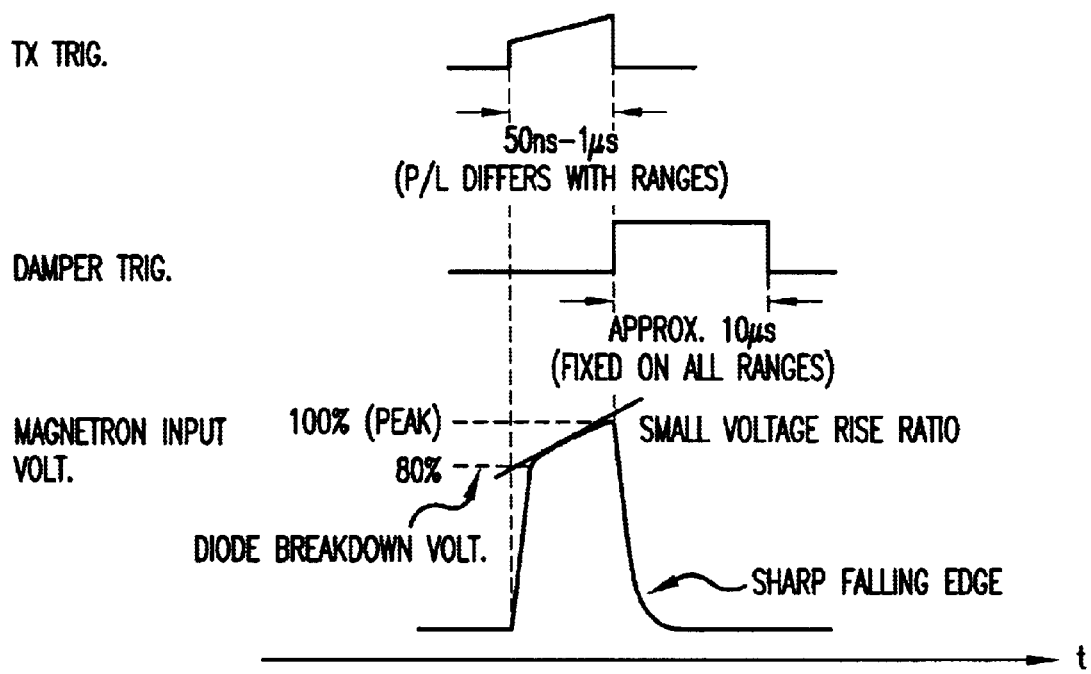
FIG. 6 is a diagram showing the waveforms of input and output pulses of the magnetron drive circuit shown in FIG. 5.

FIG. 6 is a diagram showing the waveforms of input and output pulses of the magnetron drive circuit 1 of the second embodiment. When a transmission trigger and a damper trigger shown in FIG. 6 are fed into the magnetron drive circuit 1, it outputs a narrow transmission pulse having a generally rectangular waveform with sharply shaped rising and falling edges. The transmission trigger (transmission pulse) is made to have a generally rectangular waveform with the top portion thereof gradually increasing as shown in FIG. 6. In a pulse radar, the pulselength of the transmission pulse is normally varied with range scales. As an example, the pulselength may be selected within a range of 50 ns to 1 μs. When the rectangular transmission trigger is fed into the switching FET 21 of the magnetron drive circuit 1, magnetron input voltage produced at the secondary winding 13 is made to have a generally rectangular waveform with sharply shaped rising edge and a sharply shaped falling edge because of the transmission pulse. This waveform of the transmission pulse makes it possible to decrease the rate of voltage rise of the transmission pulse within the time period during which the voltage level of the transmission pulse rises from 80% to 100% of the peak output voltage of the pulse transformer 11a in a reliable fashion. The magnetron input voltage reaches a peak point immediately before the voltage level of the transmission pulse begins to fall.

The damper trigger is ted into the active damper switching FET 31 of the magnetron drive circuit 1 when the voltage level of the transmission trigger has begun to fall. The damper trigger is a pulse having a fixed pulselength, e.g., 10 μs, regardless of the range scale of the pulse radar. Since the active damper circuit 30 absorbs the residual energy left in the pulse transformer 11a as the voltage level of the damper trigger increases, the magnetron input voltage rapidly decreases.

By making the waveform to have a generally rectangular waveform with sharply shaped rising edge and a sharply shaped falling edge, it is possible to cause the magnetron to emit a generally rectangular-shaped narrow transmission pulse (pulse-modulated radio waves) having sharply shaped rising and falling edges.

With the second embodiment of the invention, the effects produced by the first embodiment shown in FIG. 1 can also be obtained with the second embodiment shown in FIG. 5.

What is claimed is:

1. A magnetron drive circuit comprising:
   a pulse transformer for generating a pulse for driving a magnetron having an anode and a cathode; and
   a nonlinear load circuit which is connected to the cathode of the magnetron and a secondary winding of said pulse transformer connected in parallel with the magnetron, where the nonlinear load circuit becomes activated at a voltage approximately equal to a voltage at which the magnetron begins to oscillate.

2. The magnetron drive circuit according to claim 1, wherein said nonlinear load circuit includes a diode which breaks down at a voltage approximately equal to the voltage at which the magnetron begins to oscillate.

3. A magnetron drive circuit comprising:
a pulse transformer for generating a pulse for driving a magnetron; and
a nonlinear load circuit which is connected to a secondary winding of said pulse transformer in parallel with the magnetron and becomes on at a voltage approximately equal to a voltage at which the magnetron begins to oscillate;
wherein said nonlinear load circuit includes a diode which breaks down at a voltage approximately equal to the voltage at which the magnetron begins to oscillate; and
wherein said nonlinear load circuit is configured by connected a parallel circuit, which is formed of a series circuit including a first resistor having a resistance approximately equal to the rated internal impedance of the magnetron, to said diode in series.

4. A magnetron drive circuit comprising:
a pulse transformer for generating a pulse for driving a magnetron; and
a nonlinear load circuit which is connected to a secondary winding of said pulse transformer in parallel with the magnetron and becomes on at a voltage approximately equal to a voltage at which the magnetron begins to oscillate;
wherein said nonlinear load circuit includes a diode which breaks down at a voltage approximately equal to the voltage at which the magnetron begins to oscillate;
wherein said nonlinear load circuit is configured by connected a parallel circuit, which is formed of a series circuit including a first resistor having a resistance approximately equal to the rated internal impedance of the magnetron, to said diode in series; and
further comprising a residual energy absorption circuit for absorbing residual energy left in said pulse transformer by short-circuiting one of its windings at approximately the same time as the voltage level of a transmission trigger fed into a primary winding of said pulse transformer begins to fall.

5. A magnetron drive circuit comprising:
a pulse transformer for generating a pulse for driving a magnetron; and
a nonlinear load circuit which is connected to a secondary winding of said pulse transformer in parallel with the magnetron and becomes on at a voltage approximately equal to a voltage at which the magnetron begins to oscillate;
wherein said nonlinear load circuit includes a diode which breaks down at a voltage approximately equal to the voltage at which the magnetron begins to oscillate;
wherein said nonlinear load circuit is configured by connected a parallel circuit, which is formed of a series circuit including a first resistor having a resistance approximately equal to the rated internal impedance of the magnetron, to said diode in series; and
further comprising an energy management circuit for managing said transformer energy by short-circuiting at least one of its windings at approximately the same time the voltage level of a transmission trigger fed into a primary winding of said pulse transformer begins to change.

6. A magnetron drive circuit comprising:
a pulse transformer for generating a pulse for driving a magnetron; and
a residual energy absorption circuit for absorbing residual energy left in said pulse transformer by short-circuiting one of its windings approximately at the same time as the voltage level of a transmission trigger fed into a primary winding of said pulse transformer begins to fall.

7. A magnetron drive circuit comprising:
a pulse transformer for generating a pulse for driving a magnetron; and
a residual energy absorption circuit for absorbing residual energy left in said pulse transformer by short-circuiting one of its windings approximately at the same time as the voltage level of a transmission trigger fed into a primary winding of said pulse transformer begins to fall, said residual energy absorption circuit being provided to eliminate the need for an absorption resistor connected between both ends of a primary winding of said pulse transformer for generating the magnetron driving pulse for absorbing the residual energy left in said pulse transformer.

8. A radar signal generator comprising:
a magnetron for producing a radar signal;
a signal generator for producing a generally rectangular waveform with a sharply shaped rising edge and a sharply shaped falling edge and
supplying the signal from said signal generator to said magnetron.

9. The radar signal generator of claim 8 wherein a voltage level of a transmission pulse output from the magnetron rises from 80% to 100% of a peak output voltage of a pulse transformer used to transfer the signal to said magnetron.

10. The radar signal generator of claim 8 wherein a pulselength of said transmission pulse is controlled within a narrow operating band.

11. The radar signal generator of claim 10 wherein said pulselength of said transmission pulse is controlled with a narrow operating band of less than or equal to 50 microseconds.

12. The radar signal generator of claim 8 further comprising:
inputting an input voltage into said magnetron wherein said input voltage sharply increase at a rising edge of said transmission pulse and when said input voltage reaches approximately 80% of the peak voltage the rate of increase of the magnetron input voltage decreases rapidly.

13. The radar signal generator of claim 8 wherein a rate of voltage rise of said transmission pulse is decreased within a time period where the voltage level of said transmission pulse rises from 80% to 100% of a peak output voltage of said pulse transformer.

14. A magnetron drive circuit comprising:
a pulse transformer for generating a pulse for driving a magnetron;
a nonlinear load circuit connected to a secondary winding of said pulse transformer in parallel with the magnetron which turns on at a voltage approximately equal to a voltage where the magnetron begins to oscillate; and
a residual energy absorption circuit for absorbing residual energy left in said pulse transformer which short-circuits at least one of its windings at approximately the same time as a voltage level of a transmission trigger fed into a primary winding of said pulse transformer begins to fall.

15. A magnetron circuit comprising:

a transformer for driving a magnetron;

a circuit connected to a non-primary winding of said transformer in parallel with the magnetron which turns on when the magnetron begins to oscillate; and an energy absorption mechanism for absorbing energy left in said transformer which activates when a voltage level of a trigger signal fed into a primary winding of said transformer changes level.

16. A radar signal generator comprising:

a magnetron for producing a radar signal;

a pulse transformer having two primary windings and a secondary winding which is connected to said magnetron;

a first switching semiconductor device having an input terminal and a output terminal which is connected to said magnetron;

a second switching semiconductor device having an input terminal and an output terminal which is connected to one of said primary winding;

wherein a transmission signal is supplied to the input terminal of said first switching semiconductor device and a generally rectangular signal is supplied to the input terminal of said second switching semiconductor device so that a generally rectangular waveform is produced at a secondary winding of said transformer with a sharply shaped rising edge and a sharply shaped falling edge.

17. A radar signal generator comprising:

a magnetron for producing a radar signal;

a pulse transformer having at least two primary windings and at least one secondary winding which is connected to said magnetron;

a switching mechanism having an input terminal and an output terminal which is connected to said magnetron;

a second switching mechanism having an input terminal and an output terminal which is connected to one of said primary winding;

wherein a transmission signal is supplied to the input terminal of said first switching mechanism and a generally rectangular signal is supplied to the input terminal of said second switching mechanism so that a generally rectangular waveform is produced at a secondary winding of said transformer with a sharply shaped rising edge and a sharply shaped falling edge.

18. The radar signal generator of claim 17 wherein a voltage level of a transmission pulse output from the magnetron rises from 80% to 100% of a peak output voltage of a pulse transformer.

19. The radar signal generator of claim 17 wherein a pulselength of said transmission pulse is controlled within a narrow operating band.

20. The radar signal generator of claim 19 wherein said pulselength of said transmission pulse is controlled with a narrow operating band of less than or equal to 50 microseconds.

21. The radar signal generator of claim 17 further comprising:

inputting an input voltage into said magnetron wherein said input voltage sharply increase at a rising edge of said transmission pulse and when said input voltage reaches approximately 80% of the peak voltage the rate of increase of the magnetron input voltage decreases rapidly.

22. The radar signal generator of claim 17 wherein a rate of voltage rise of said transmission pulse is decreased within a time period where the voltage level of said transmission pulse rises from 80% to 100% of a peak output voltage of said pulse transformer.

* * * * *